United States Patent
Kim et al.

(10) Patent No.: US 7,511,295 B2
(45) Date of Patent: Mar. 31, 2009

(54) ORGANIC LIGHT EMITTING DISPLAY DEVICE HAVING AN ENCAPSULATION SUBSTRATE AND A PORTION OF AN INTERCONNECTION LINE THEREON

(75) Inventors: Sun-Hwa Kim, Suwon-si (KR); Bong-Ju Shin, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 0 days.

(21) Appl. No.: 11/346,921

(22) Filed: Feb. 2, 2006

(65) Prior Publication Data

US 2006/0170342 A1    Aug. 3, 2006

(30) Foreign Application Priority Data

Feb. 3, 2005    (KR) ...................... 10-2005-0010271

(51) Int. Cl.
*H01L 29/08* (2006.01)
*H01L 35/24* (2006.01)
*H01L 51/00* (2006.01)

(52) U.S. Cl. .............................. 257/40; 257/72; 257/79

(58) Field of Classification Search .................... 257/40
See application file for complete search history.

(56) References Cited

U.S. PATENT DOCUMENTS

| | | | |
|---|---|---|---|
| 2002/0014628 A1* | 2/2002 | Koyama | ...................... 257/72 |
| 2003/0183830 A1* | 10/2003 | Yamazaki et al. | ............. 257/90 |
| 2005/0057580 A1* | 3/2005 | Yamano et al. | ............. 345/690 |
| 2005/0078105 A1* | 4/2005 | Suh | ............................. 345/204 |
| 2005/0093467 A1* | 5/2005 | Suh | ........................ 315/169.3 |
| 2005/0184927 A1* | 8/2005 | Kwak | .......................... 345/45 |

FOREIGN PATENT DOCUMENTS

JP    H04-031299    3/1992

(Continued)

OTHER PUBLICATIONS

Korean Patent Abstracts, Publication No. 1020040059036 A, dated Jul. 5, 2004, in the name of Hun Ju Jung et al.

(Continued)

*Primary Examiner*—Jerome Jackson, Jr.
*Assistant Examiner*—Anthony Ho
(74) *Attorney, Agent, or Firm*—Christie, Parker & Hale, LLP

(57) ABSTRACT

Provided is an organic light emitting diode (OLED) display device including a substrate on a front side of the OLED display device that is coupled to an encapsulation substrate on the back side of the OLED display device. An interconnection line is disposed in a predetermined region of the encapsulation substrate corresponding to a portion of the substrate on which no interconnection lines are disposed. Alternatively, a common power supply line is disposed only on the encapsulation substrate. As a result, a dead space in a display region of the substrate can be reduced so that other lines can be disposed in an interconnection line region of the substrate, and the display region can be further expanded. Also, since a wide interconnection line can be disposed on the encapsulation substrate, line resistance is decreased and a voltage drop can be reduced.

22 Claims, 12 Drawing Sheets

FOREIGN PATENT DOCUMENTS

| | | |
|---|---|---|
| JP | 2001-236025 | 8/2001 |
| JP | 2001-345179 | 12/2001 |
| JP | 2002-033198 | 1/2002 |
| JP | 2003-187970 | 7/2003 |
| JP | 2003-280551 | 10/2003 |
| JP | 2004-246330 | 9/2004 |
| JP | 2004-253303 | 9/2004 |
| JP | 2004-327215 | 11/2004 |
| KR | 10-2004-0059036 | 7/2004 |
| KR | 1020040059036 * | 7/2004 |

OTHER PUBLICATIONS

Japanese Office action for the corresponding Japanese Patent Application No. 2006-014145, issued on Nov. 25, 2008 indicating relevance of cited references.

* cited by examiner

ORGANIC LIGHT EMITTING DISPLAY DEVICE HAVING AN ENCAPSULATION SUBSTRATE AND A PORTION OF AN INTERCONNECTION LINE THEREON

CROSS-REFERENCE TO RELATED APPLICATION

This application claims priority to and the benefit of the Korean Patent Application No. 10-2005-0010271, filed Feb. 3, 2005, in the Korean Intellectual Property Office, the entire content of which is incorporated herein by reference.

BACKGROUND OF THE INVENTION

1. Field of the Invention

The present invention relates to an organic light emitting display device, and more particularly, to an organic light emitting display device in which interconnection lines are disposed in a predetermined region of an encapsulation substrate.

2. Description of the Related Art

Among flat panel display devices (FPDs), the organic light emitting display device, or organic light emitting diode (OLED) display device, has attracted much attention as the next generation FPD. Because the OLED display device is a self-emissive display device, it has advantages of a wide viewing angle, a fast response time, and a high contrast, and can be fabricated with a small thickness at low cost. In such an OLED display device, electrons and holes (or carriers) in a semiconductor form pairs to make a transition from an excited state to a ground state, thus emitting light. The OLED display device can be classified into a passive matrix OLED (PMOLED) display device and an active matrix OLED (AMOLED) display device depending on its driving method.

FIGS. 1A, 1B, and 1C respectively show a plan view of a substrate, a bottom view of an encapsulation substrate, and a cross-sectional view of a display device in a conventional OLED display device. The substrate may be considered a front substrate while the encapsulation substrate may be considered a back substrate.

Referring to FIG. 1A, a display region 150 including predetermined pixels is disposed on a substrate 100. A common power supply line 110 is disposed adjacent to the display region 150 and is used to apply a power supply voltage to common power lines 160. The power supply voltage is typically referred to as Vdd in the literature. The common power lines 160 are electrically connected to the common power supply line 110 and used to apply a voltage to each of the pixels. A scan driver 140 outputs a selection signal, and a data driver 130 outputs a data signal. The common power lines 160 are electrically connected to top and bottom portions of the common power supply line 110 and receives power.

Also, a cathode electrode 120 is arranged over the display region 150. A cathode power supply line 170 is disposed on one side of the display region 160 and overlaps the cathode electrode 120. The cathode power supply line 170 is used to apply a cathode voltage to the cathode electrode 120.

Other interconnection lines including the common power supply line 110 and the cathode power supply line 170 are electrically connected to a pad 180 and receive predetermined power.

As described above, a number of interconnection lines are arranged on the substrate 100 so that the display region 150 is reduced by the area occupied by the interconnection lines (hereinafter referred to as a "dead space"). Further, as the OLED display device includes more varied and complicated functions, it needs more interconnection lines. Therefore, it is important to reduce the dead space in order to expand the display region 150 or downscale the display device. In some cases, the interconnection lines are formed with a small width to scale down the display device. However, this method leads to an increase in voltage drop along the line due to increased resistance of the narrower line, which results in an increase in the product of current and resistance (IR) or the voltage drop.

FIG. 1B shows a bottom surface of an encapsulation substrate 101, and FIG. 1C shows a cross-section taken along the line I-I' of FIGS. 1A and 1B. In FIGS. 1B and 1C, a peripheral portion 190 refers to a region of the encapsulation substrate 101 that is bonded to the substrate 100 using an adhesive 102 coated on the substrate 100. A space over the substrate 100 is hermetically sealed by the encapsulation substrate 101 and may contain a moisture absorbent material (not shown) to protect organic light emitting diodes (OLEDs) 103 disposed on the substrate 100. In particular, the moisture absorbent material may be provided on the bottom surface, i.e. the internal surface, of the encapsulation substrate 101.

SUMMARY OF THE INVENTION

The present invention provides an organic light emitting display device or an organic light emitting diode (OLED) display device that can include an expanded display region by reducing a dead space while also reducing a voltage drop in the display device.

In an exemplary embodiment of the present invention, an OLED display device includes a substrate having a display region in which pixels are disposed and an interconnection line. This interconnection line located on the substrate may be called a first interconnection line. An encapsulation substrate is disposed over the substrate, and an interconnection line is disposed in a predetermined region of a surface of the encapsulation substrate opposite to the substrate. This interconnection line located on the encapsulation substrate may be called a second interconnection line. The interconnection line disposed on the encapsulation substrate is disposed in a region other than a portion corresponding to the interconnection line disposed on the substrate. In this structure, other interconnection lines can be disposed in a region of the substrate where the interconnection line was conventionally disposed, and as a result the display region can be further enlarged. Also, since the interconnection line disposed on the encapsulation substrate can be wide without sacrificing area used for the display region on the substrate, a voltage drop can be reduced. The substrate may be a front substrate where the display region is located and the encapsulation substrate may be a back substrate. The first and second interconnection lines together may form the overall interconnection line.

The overall interconnection line may be a common power supply -line for supplying power to common power lines disposed on the substrate. The common power supply line may include a first common power supply line located on the substrate and a second common power supply line located on the encapsulation substrate. The second common power supply line disposed on the encapsulation substrate may be connected to the first common power supply line disposed on the substrate. Specifically, the second common power supply line disposed on the encapsulation substrate may be electrically connected to the first common power supply line disposed on the substrate using a conductive material. The conductive material may be an anisotropic conductive material (ACF).

The second common power supply line disposed on the encapsulation substrate may be formed of a conductive material and may be wider than the first common power supply line disposed on the substrate.

The display region may include an anode electrode, a cathode electrode, and an organic thin layer interposed between the anode electrode and the cathode electrode. The interconnection line may be a cathode power supply line for applying a predetermined voltage to the cathode electrode. The cathode power supply line may include a first cathode power supply line located on the substrate and a second cathode power supply line located on the encapsulation substrate. The second cathode power supply line disposed on the encapsulation substrate may be connected to the first cathode power supply line disposed on the substrate. Specifically, the second cathode power supply line disposed on the encapsulation substrate may be electrically connected to the first cathode power supply line disposed on the substrate using a conductive material. The conductive material may be an ACF. The first cathode power supply line disposed on the substrate may be formed of the same material as the anode electrode.

The second cathode power supply line disposed on the encapsulation substrate may be formed of a conductive material and may be wider than the first cathode power supply line disposed on the substrate.

In another exemplary embodiment of the present invention, an OLED display device includes a substrate having a display region in which pixels are disposed. An encapsulation substrate is disposed over the substrate, and a common power supply line is disposed in a predetermined region of a surface of the encapsulation substrate opposite to the substrate. Here, the common power supply line is not disposed on the substrate; rather, it is disposed only on the encapsulation substrate.

The common power supply line disposed on the encapsulation substrate may be connected to common power lines and a pad that are disposed on the substrate. Specifically, the common power supply line disposed on the encapsulation substrate may be electrically connected to the common power lines and the pad disposed on the substrate using a conductive material. The conductive material may be an ACF.

The common power supply line disposed on the encapsulation substrate may be formed of a conductive material.

In still another exemplary embodiment of the present invention, an OLED display device includes a substrate having a display region in which pixels are disposed. The display region includes an anode electrode, a cathode electrode, and an organic thin layer interposed between the anode electrode and the cathode electrode. An encapsulation substrate is disposed over the substrate, and a cathode power supply line is disposed in a predetermined region of a surface of the encapsulation substrate opposite the substrate. Here, the cathode power supply line is not disposed on the substrate.

The cathode power supply line disposed only on the encapsulation substrate may be connected to the cathode electrode disposed on the substrate. Specifically, the cathode power supply line disposed on the encapsulation substrate may be electrically connected to the cathode electrode disposed on the substrate using a conductive material. The conductive material may be an ACF.

The OLED display device may further include an insulating layer disposed on the cathode electrode, and the cathode power supply line disposed on the encapsulation substrate may be electrically connected to the cathode electrode disposed on the substrate through at least one contact hole disposed in the insulating layer.

BRIEF DESCRIPTION OF THE DRAWINGS

The above and other features of the present invention will be described with reference to the attached drawings in which.

DETAILED DESCRIPTION

The present invention will now be described more fully hereinafter with reference to the accompanying drawings, in which exemplary embodiments of the invention are shown. This invention may, however, be embodied in different forms and should not be construed as limited to the embodiments set forth herein.

Figure 1A:
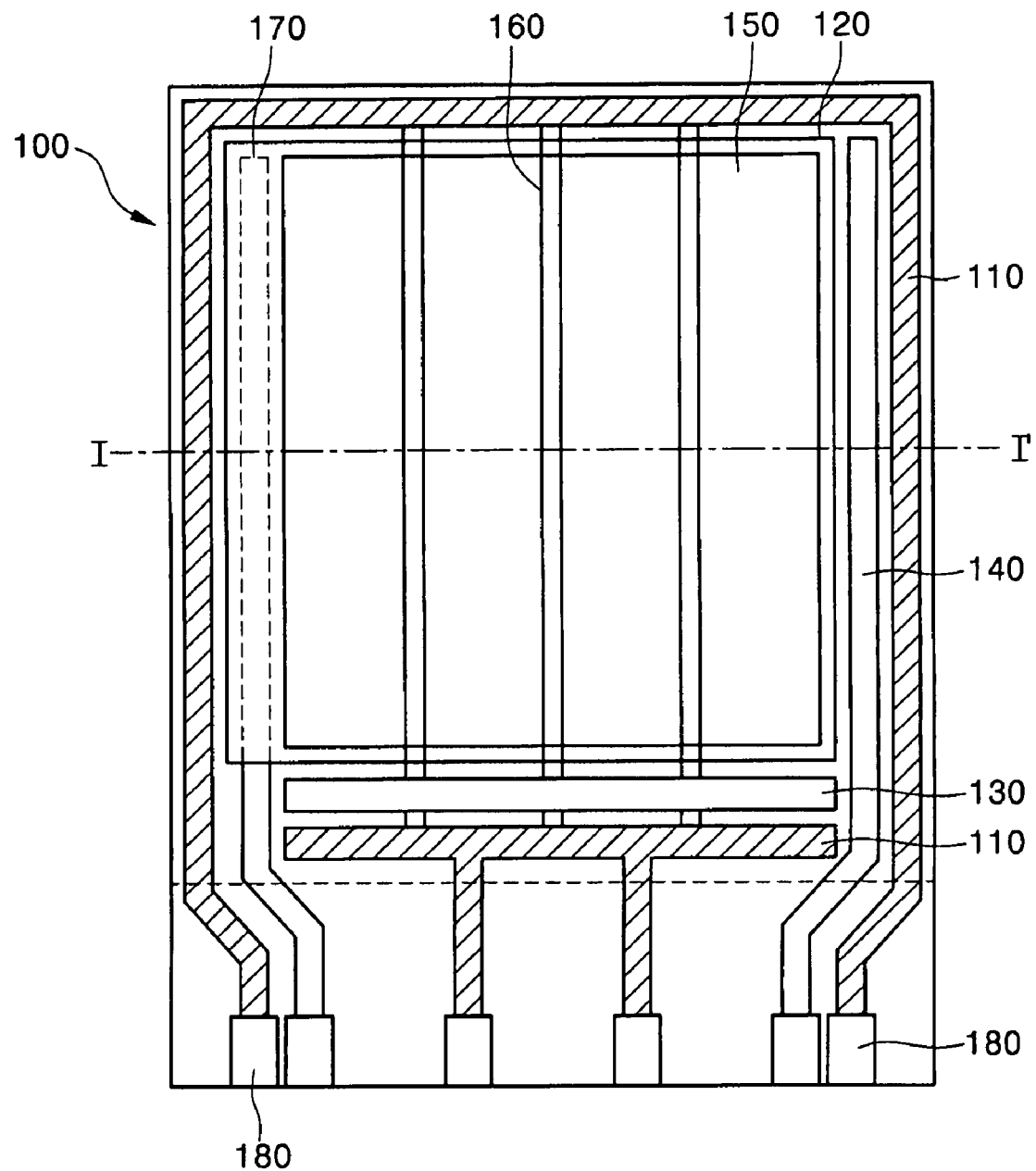
FIGS. 1A, 1B, and 1C respectively illustrate a plan view of a substrate, a bottom view of an encapsulation substrate, and a cross-sectional view of a conventional organic light emitting display device or an organic light emitting diode (OLED) display device.
Figure 1B:
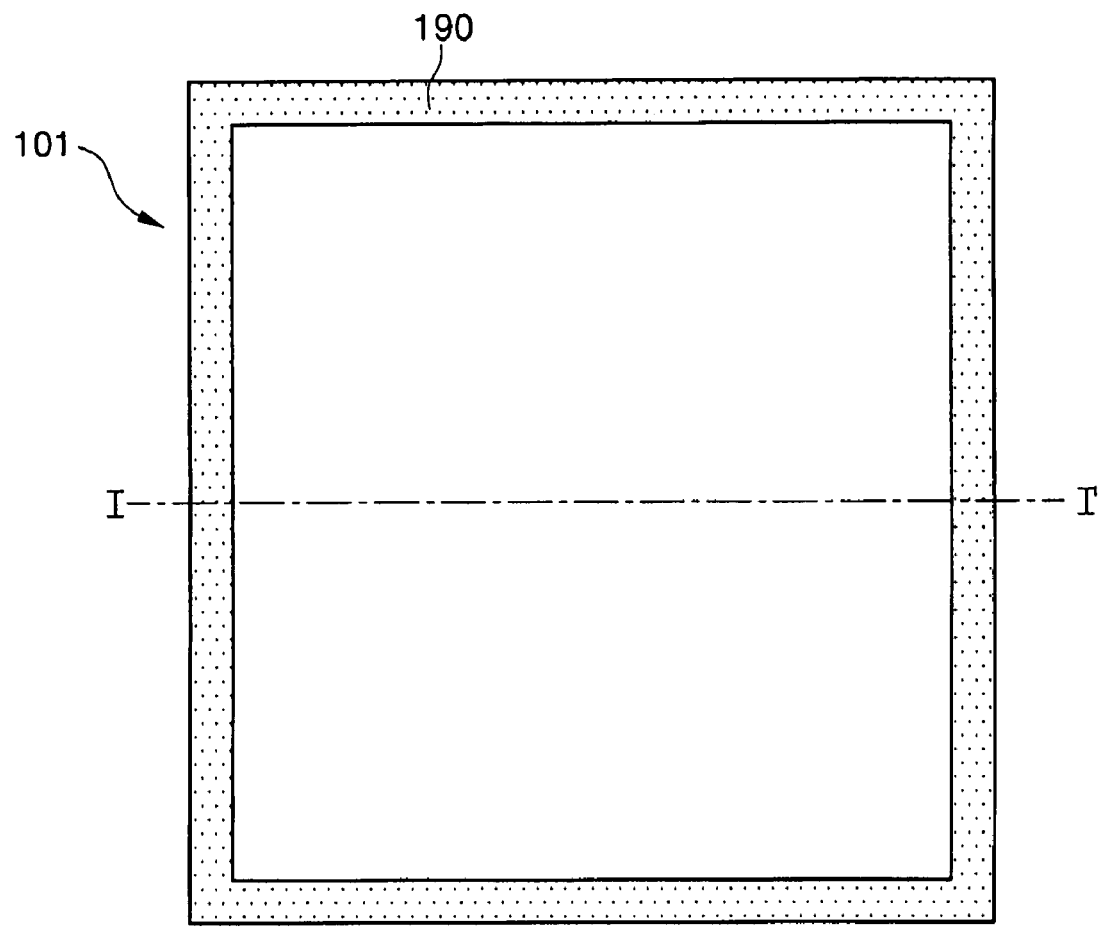
Figure 1C:
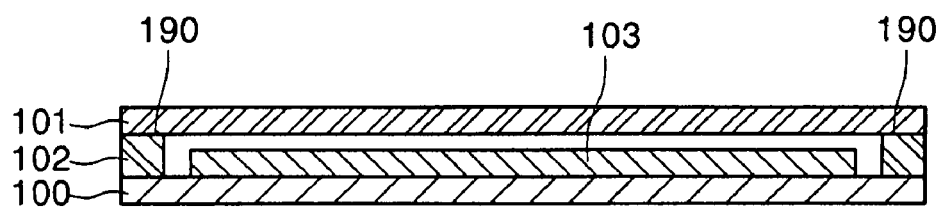
Figure 2A:
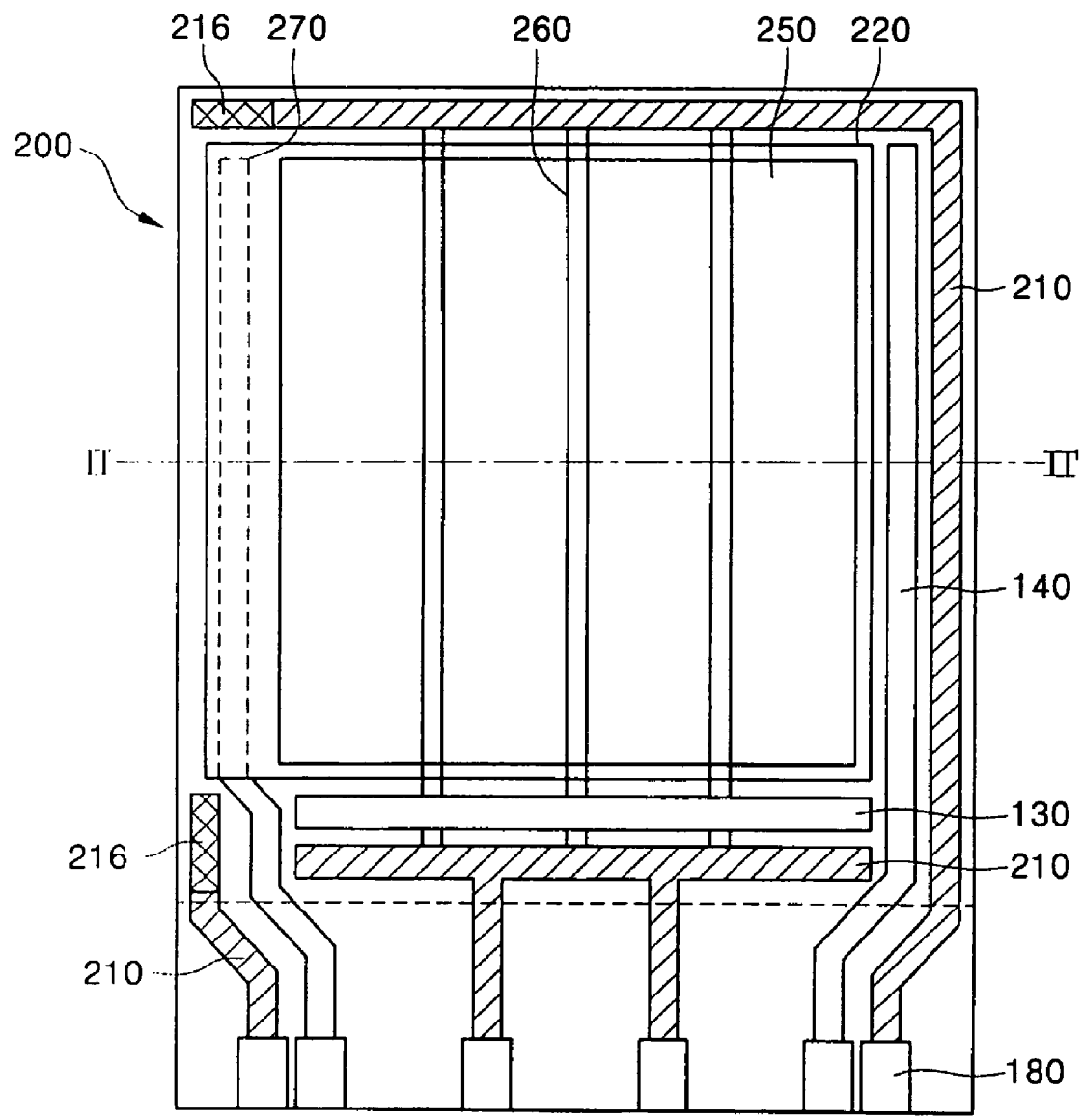
FIGS. 2A, 2B, and 2C respectively illustrate a plan view of a substrate, a bottom view of an encapsulation substrate, and a cross-sectional view of an OLED display device according to a first exemplary embodiment of the present invention.
Figure 2B:
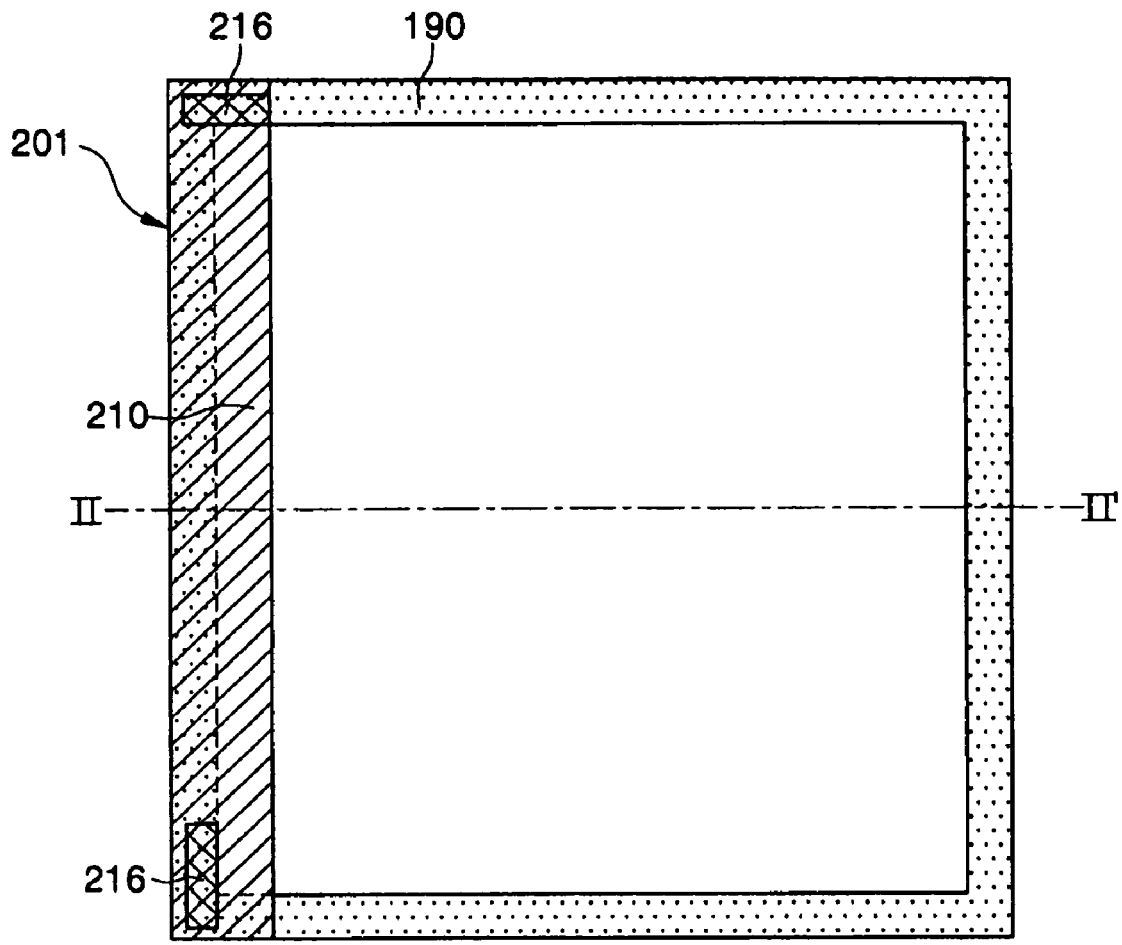
Figure 2C:
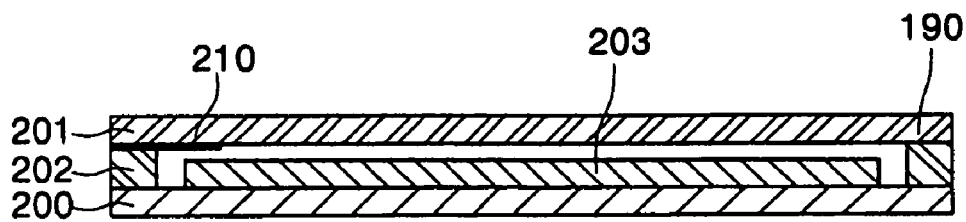

FIGS. 2A to 2C respectively illustrate a plan view of a substrate, a bottom view of an encapsulation substrate, and a cross-sectional view of an organic light emitting display device or an organic light emitting diode (OLED) display device according to a first exemplary embodiment of the present invention.

Referring to FIG. 2A, a display region 250 including predetermined pixels is disposed on a substrate 200. Common power lines 260, scan lines (not shown), and data lines (not shown) are disposed in the display region 250. The common power lines 260 are used to apply a voltage to the respective pixels. The scan lines are connected to a scan driver 140 that outputs selection signals, and the data lines are connected to a data driver 130 that outputs data signals. The scan lines cross over the common power lines 260, and the data lines are disposed parallel to the common power lines 260. The data lines are insulated from the scan lines and disposed across the scan lines. Unit display regions are defined by the scan lines and the data lines that cross over each other. Although FIG. 2A shows only three common power lines 260, the present invention is not limited thereto but a larger number of common power lines can be disposed in the display region 250.

A common power supply line 210 is disposed around the display region 250. The common power lines 260 are electrically connected to top and bottom portions of the common power supply line 210 and receives power. In the present embodiment, the common power supply line 210 is disposed on peripheral regions of the substrate 200 except on the left side of the display region 250. A portion of the common power supply line 210 is disposed in a predetermined region of an encapsulation substrate 201 that will be described later, instead of being located on the left side of the display region 250. As a result, interconnection lines other than the common power supply line 210 may be disposed on the left side of the display region 250. In other words, the display region 250 can be further expanded and a dead space can be reduced.

A cathode electrode 220 is disposed over the display region 250 and may extend to a left peripheral region of the substrate 200. A portion of the cathode electrode 220 along the left peripheral region may be wider than other portions of the cathode electrode 220. A cathode power supply line 270 is disposed on the left side of the display region 250. The cathode power supply line 270 overlaps the cathode electrode 220 and applies a cathode voltage to the cathode electrode 220.

As described above, in the first exemplary embodiment, the cathode power supply line 270, but not the common power supply line 210, is disposed on the left side of the display region 250, so that the display region 250 can be expanded. In the present embodiment, it is exemplarily illustrated that the cathode power supply line 270 is disposed on the left side of the display region 250. However, the present invention is not limited thereto but the cathode power supply line 270 may be disposed on the right side of the display region 250 or in other regions. In this case, the common power supply line 210 is disposed neither on the right side of the display region 250 nor in the other regions but in a region of the encapsulation substrate 201 corresponding to the region where the cathode power supply line 270 is disposed.

Other interconnection lines including the common power supply line 210 and the cathode power supply line 270 are electrically connected to a pad 180 and receive predetermined power.

FIG. 2B shows a bottom surface of the encapsulation substrate 201, and FIG. 2C shows a cross-section taken along the line II-II' of FIGS. 2A and 2B. In FIGS. 2B and 2C, a peripheral region 190 refers to a region of the encapsulation substrate 201 that is bonded to the substrate 200 using an adhesive 202 coated on the substrate 200.

An interconnection line is disposed on a surface of the encapsulation substrate 201 opposite to the substrate 200. The interconnection line may be the common power supply line 210 that is disposed on a left side of the encapsulation substrate 201. That is, the common power supply line 210 is disposed on a region of the encapsulation substrate 201 corresponding to a region of the substrate 200 where the common power supply line 210 is not disposed. The common power supply line 210 may be disposed not only on the left peripheral region of the encapsulation substrate 201 but also on all peripheral regions thereof. Also, the common power supply line 210 may take on various shapes, for example, a line or a curved shape.

The common power supply line 210 disposed on the encapsulation substrate 201 may be formed of a conductive material. Also, the common power supply line 210 disposed on the encapsulation substrate 201 may be formed with a larger width than the common power supply line 210 disposed on the substrate 200. Accordingly, even if the common power supply line 210 is formed with a small width on the substrate 200, a voltage drop can be reduced. This is due to the fact that the wide portion of the common power supply line compensates for the higher resistance of the narrow portion and the overall line resistance is not decreased.

Referring again to FIGS. 2A and 2B, the common power supply line 210 disposed on the encapsulation substrate 201 is electrically connected to the common power supply line 210 disposed on the substrate 200. Since the common power supply line 210 is an interconnection line supplying power, the common power supply line 210 disposed on the encapsulation substrate 201 may be electrically connected to the common power supply line 210 disposed on the substrate 200 using a conductive material.

The conductive material used for the connection of the common power supply lines 210 disposed on the substrate 200 and the encapsulation substrate 201 may be an anisotropic conductive film (ACF). The ACF refers to an adhesive film that is obtained by scattering fine conductive particles with a diameter of about 3 to 15 μm on an insulating adhesive with a thickness of about 15 to 35 μm.

The ACF is interposed in a connection portion 216 between the common power supply lines 210 disposed on the substrate 200 and the encapsulation substrate 201. The ACF is heated at a temperature of 160 to 180° C. for about 10 to 20 seconds or pressurized under a pressure of 2 to 3 mega Pascal (MPa) until the ACF melts. In this case, since the scattered conductive particles are protected between the common power supply lines 210, the conductive particles remain conductive. Meanwhile, the common power supply lines 210 disposed on the substrate 200 and the encapsulation substrate 201 combine due to reliable adhesive strength of the ACF.

In another method, an insulating layer may be provided on the common power supply line 210 disposed on the substrate 200. In this case, a contact hole may be made in the insulating layer and filled with the ACF so that the common power supply line 210 disposed on the substrate 200 can be electrically connected to the common power supply line 210 disposed on the encapsulation substrate 201.

In yet another method, the position of the ACF may overlap the portion of the substrate 200 that is hermetically sealed by the encapsulation substrate 201. In this case, the ACF may be interposed between the adhesive 202 coated along the peripheral regions of the substrate 200, and thus the common power supply line 210 disposed on the substrate 200 can be electrically connected to the common power supply line 210 disposed on the encapsulation substrate 201 during the encapsulation of the substrate 200 and the encapsulation substrate 201.

By combining the encapsulation substrate 201 with the substrate 200 using the adhesive 202, a single panel is obtained. That is, the adhesive 202 coated along the peripheral regions of the substrate 200 is cured with the irradiation of ultraviolet (UV) rays, at a predetermined temperature, so that the space over the substrate 200 can be sealed by the encapsulation substrate 201.

Although not shown in the drawings, a moisture absorbent material may be placed in an inner space created between the encapsulation substrate 201 and the substrate 200 in order to protect organic light emitting diodes 203 disposed on the substrate 200. In particular, the moisture absorbent material may be coated on the bottom surface of the encapsulation substrate 201.

Figure 3A:
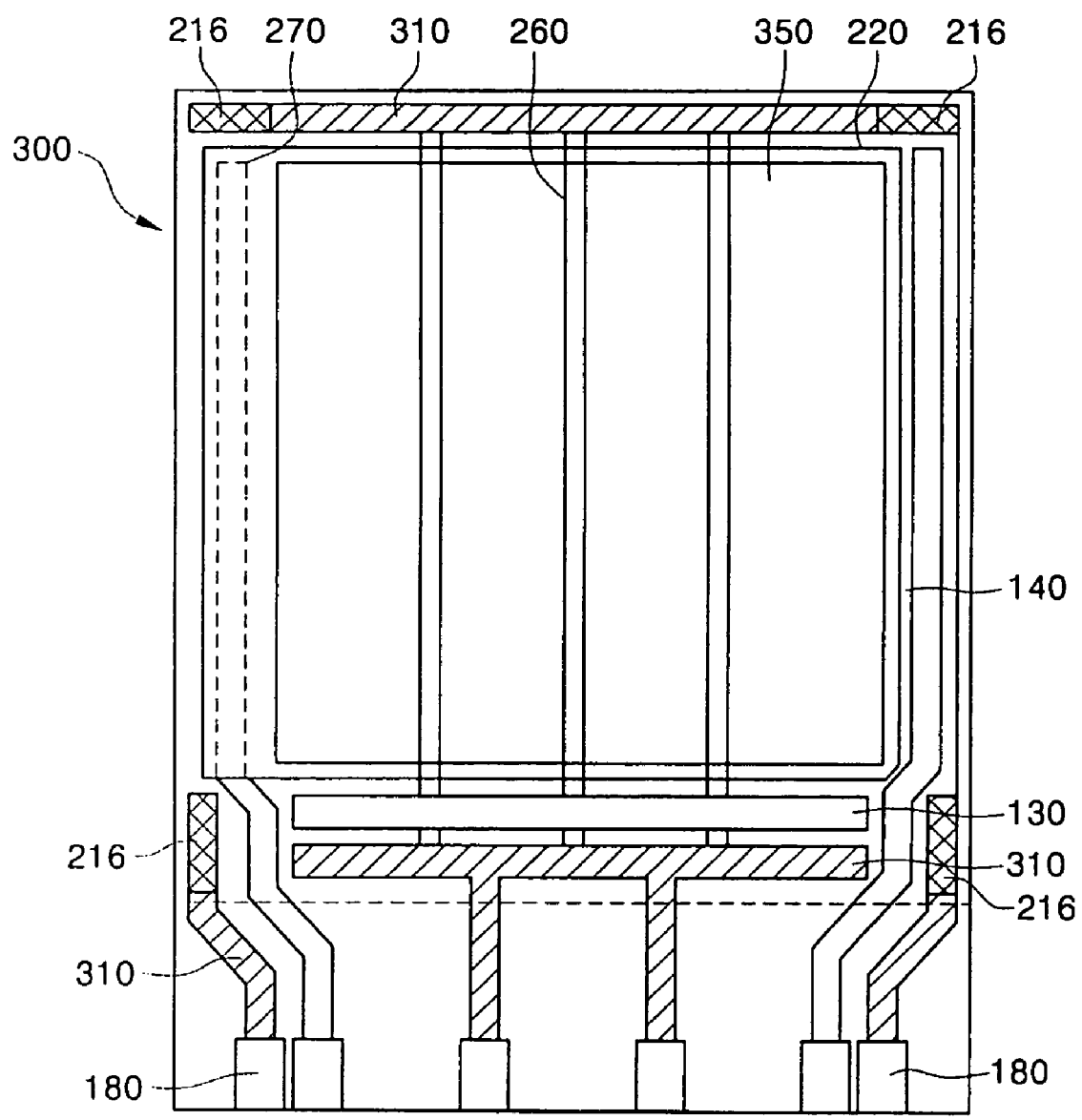
FIGS. 3A and 3B respectively illustrate a plan view of a substrate and a bottom view of an encapsulation substrate of an OLED display device according to a second exemplary embodiment of the present invention.
Figure 3B:
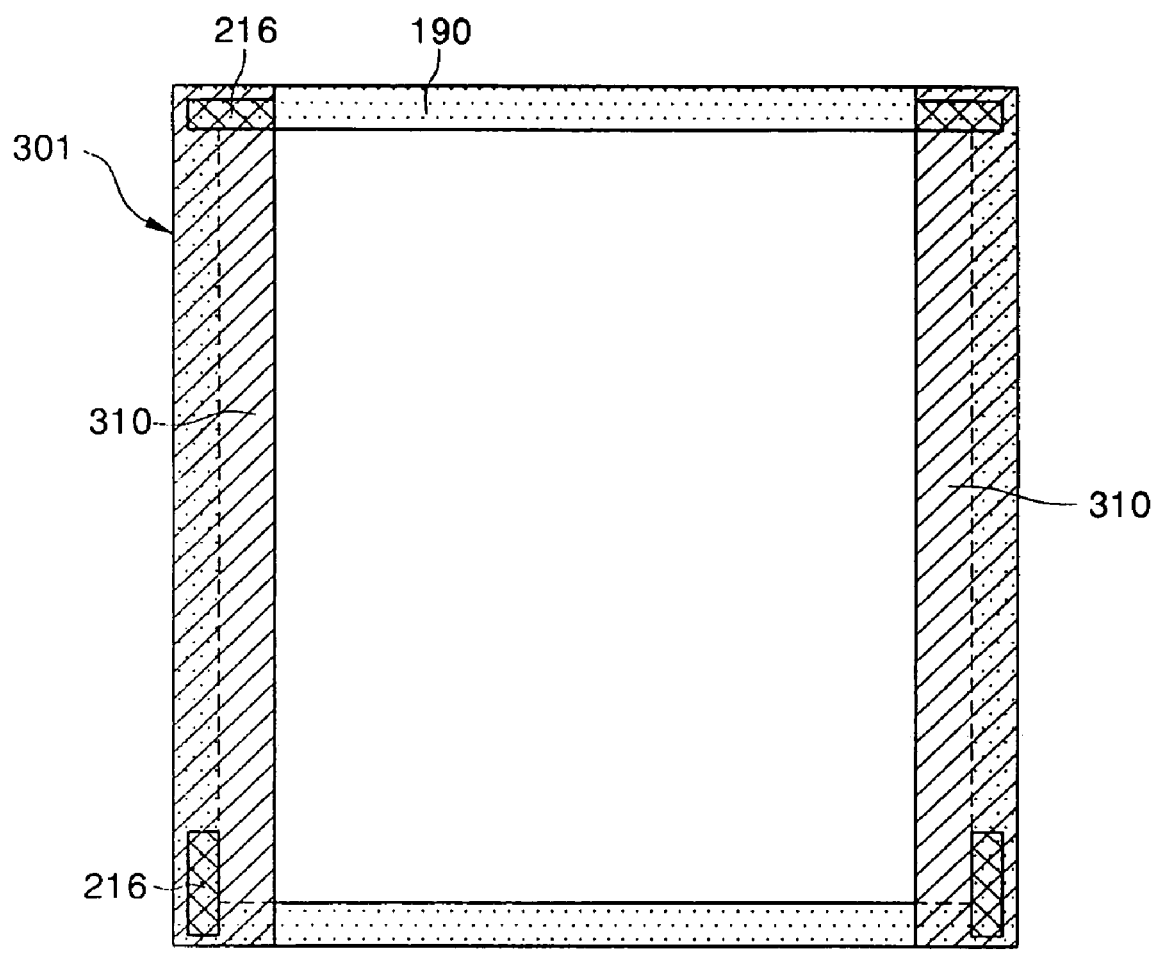

FIGS. 3A and 3B respectively illustrate a plan view of a substrate and a bottom view of an encapsulation substrate of an OLED display device according to a second exemplary embodiment of the present invention.

Referring to FIG. 3A, in the second exemplary embodiment, a common power supply line 310 is disposed on peripheral regions of a substrate 300 except on left and right sides of a display region 350. A portion of the common power supply line 310 is disposed in a predetermined region of an encapsulation substrate 301, that will be described later, instead of on the left and right sides of the display region 350. As a result, interconnection lines other than the common power supply line 310 may be disposed on the left and right peripheral regions of the display region 350 or the display region 350 can be further expanded. In other words, a dead space can be reduced.

FIG. 3B shows a bottom surface of the encapsulation substrate 301.

Referring to FIG. 3B, the common power supply line 310 is disposed on a surface of the encapsulation substrate 301 opposite to the substrate 300. The common power supply line 310 may be disposed on left and right sides of the encapsulation substrate 301.

The OLED display device of the present embodiment is similar to the OLED display device of the first embodiment except for the differences described in that foregoing paragraphs.

Figure 4A:
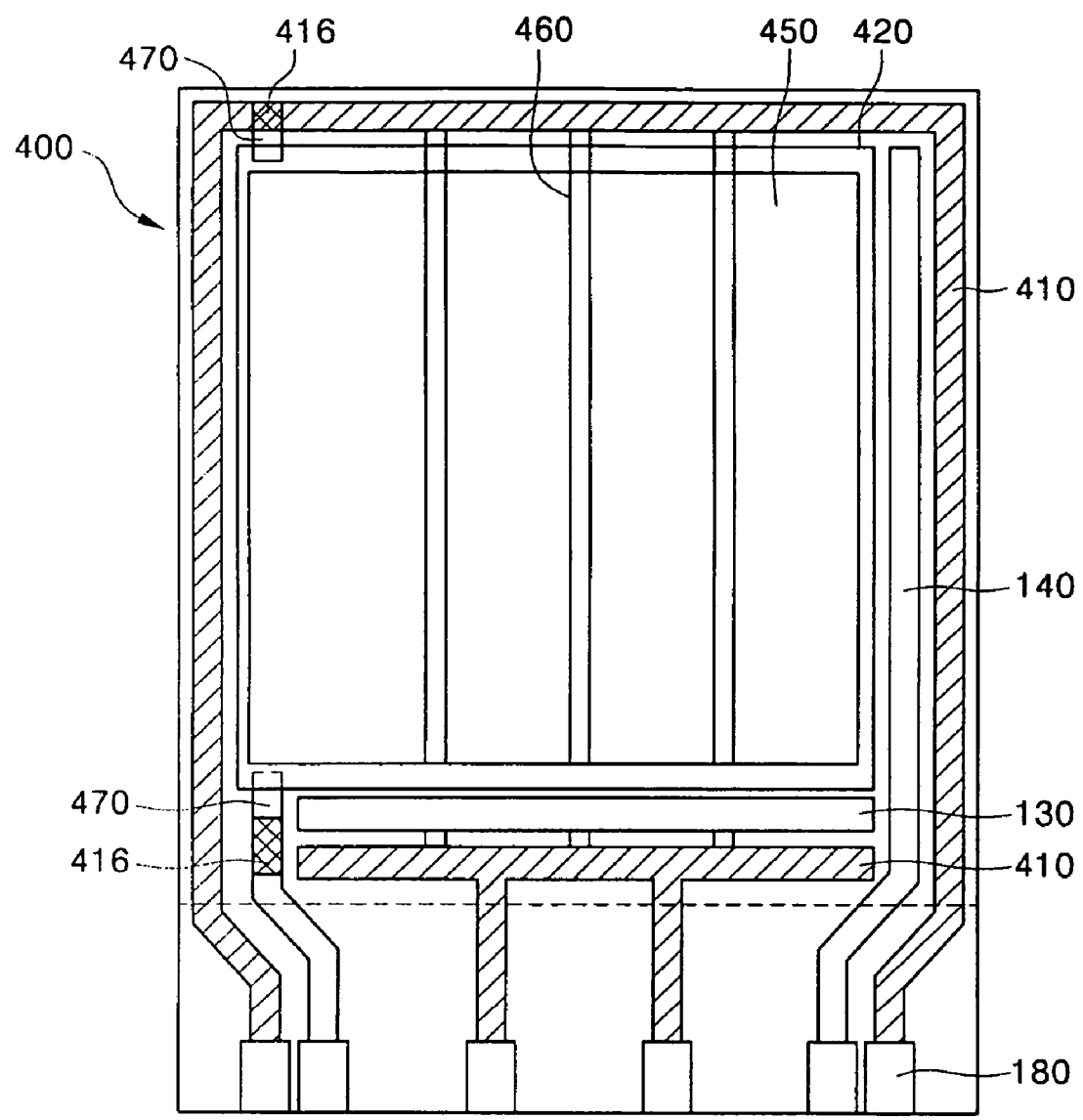
FIGS. 4A and 4B respectively illustrate a plan view of a substrate and a bottom view of an encapsulation substrate of an OLED display device according to a third exemplary embodiment of the present invention.
Figure 4B:
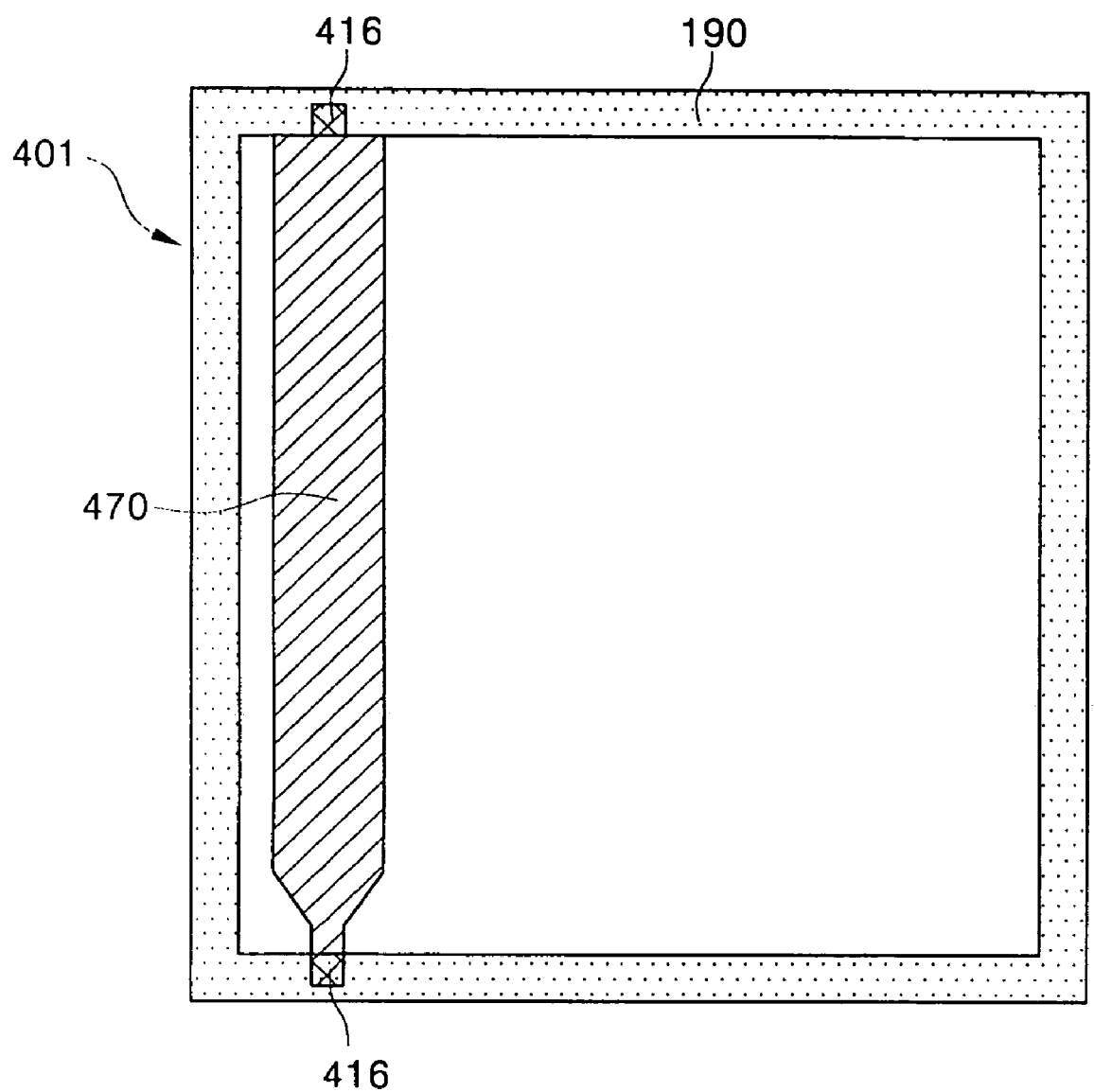

FIGS. 4A and 4B respectively illustrate a plan view of a substrate and a bottom view of an encapsulation substrate of an OLED display device according to a third exemplary embodiment of the present invention.

Referring to FIG. 4A, a display region 450 including predetermined pixels is disposed on a substrate 400. Common power lines 460, scan lines (not shown), and data lines (not shown) are disposed in the display region 450. The common power lines 460 are used to apply a voltage to the respective pixels. The scan lines are connected to a scan driver 140 that outputs selection signals, and the data lines are connected to a data driver 130 that outputs data signals.

The display region 450 may include an anode electrode (not shown), a cathode electrode 420, and a thin organic layer (not shown) interposed between the anode electrode and the cathode electrode 420, thus forming an organic light emitting diode.

A common power supply line 410 is disposed around the display region 450 and supplies power to the common power lines 460.

The cathode electrode 420 is disposed on the display region 450. In the present embodiment, a cathode power supply line 470 is disposed on a left upper edge of the display region 450 and overlaps the cathode electrode 420 and is electrically coupled to the cathode electrode 420 so that a cathode voltage is applied to the cathode electrode 420. That is, unlike in the case of the first embodiment, the cathode power supply line 470 is not disposed all along the left side of the display region 450. The cathode electrode 420 may be formed of the same material as the anode electrode. Thus, the cathode power supply line 470 can be patterned at the same time as when the anode electrode is formed. Also, even if the cathode power supply line 470 overlaps the common power supply line 410, the cathode power supply line 470 can remain insulated from the common power supply line 410.

A portion of the cathode power supply line 470 is disposed in a predetermined region of an encapsulation substrate 401, that will be described later, instead of on the left side of the display region 450. As a result, the display region 450 can be further expanded.

FIG. 4B shows a bottom surface of the encapsulation substrate 401.

Referring to FIG. 4B, the above mentioned portion of the cathode power supply line 470 is disposed on a surface of the encapsulation substrate 401 opposite to the substrate 400. The cathode power supply line 470 may be disposed on a left side of the encapsulation substrate 401.

The cathode power supply line 470 disposed on the encapsulation substrate 401 may be formed of a conductive material. Also, the cathode power supply line 470 disposed on the encapsulation substrate 401 may be wider than the cathode power supply line 470 disposed on the substrate 400. Accordingly, even if the cathode power supply line 470 disposed on the substrate 400 overlaps the cathode electrode 420 only on the left upper edge of the display region 450, a voltage drop can be reduced. Because while the overlap area that provides the electrical connection may be small and of high resistance, the wider portion of the cathode power supply line 470 located on the encapsulation substrate 401 provides a low resistance path for the current.

Referring again to FIG. 4A, the cathode power supply line 470 disposed on the encapsulation substrate 401 is electrically connected to the cathode power supply line 470 disposed on the substrate 400. Since the cathode power supply line 470 is an interconnection line receiving power, the cathode power supply line 470 disposed on the encapsulation substrate 401 may be electrically connected to the cathode power supply line 470 disposed on the substrate 400 using a conductive material.

The conductive material may be an ACF. The ACF is disposed in a connection portion 416 between the cathode power supply lines 470 disposed on the substrate 400 and the encapsulation substrate 401.

The OLED display device of the present embodiment is similar to the OLED display device of the first embodiment except for the above described differences.

Figure 5A:
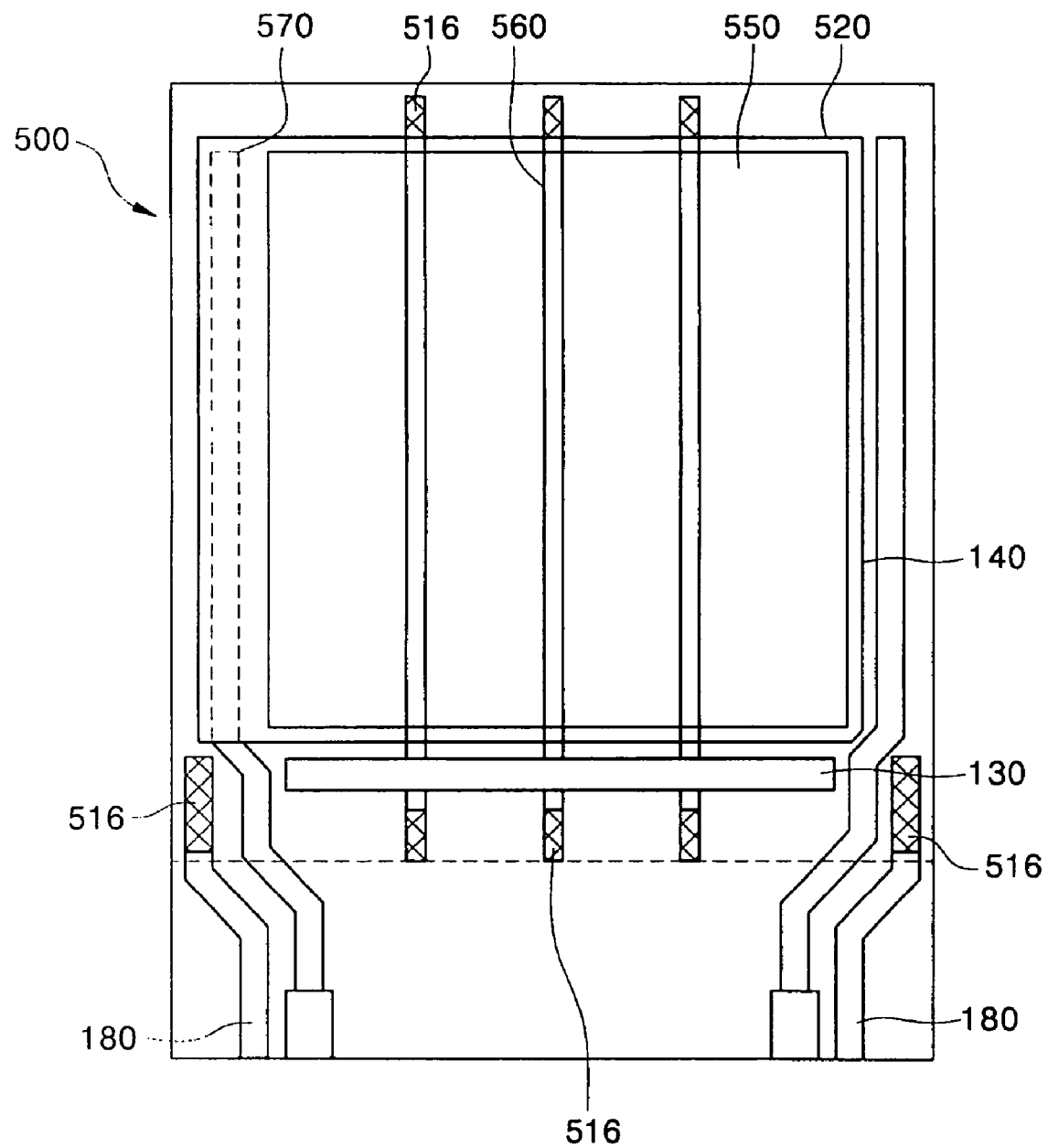
FIGS. 5A and 5B respectively illustrate a plan view of a substrate and a bottom view of an encapsulation substrate of an OLED display device according to a fourth exemplary embodiment of the present invention.
Figure 5B:
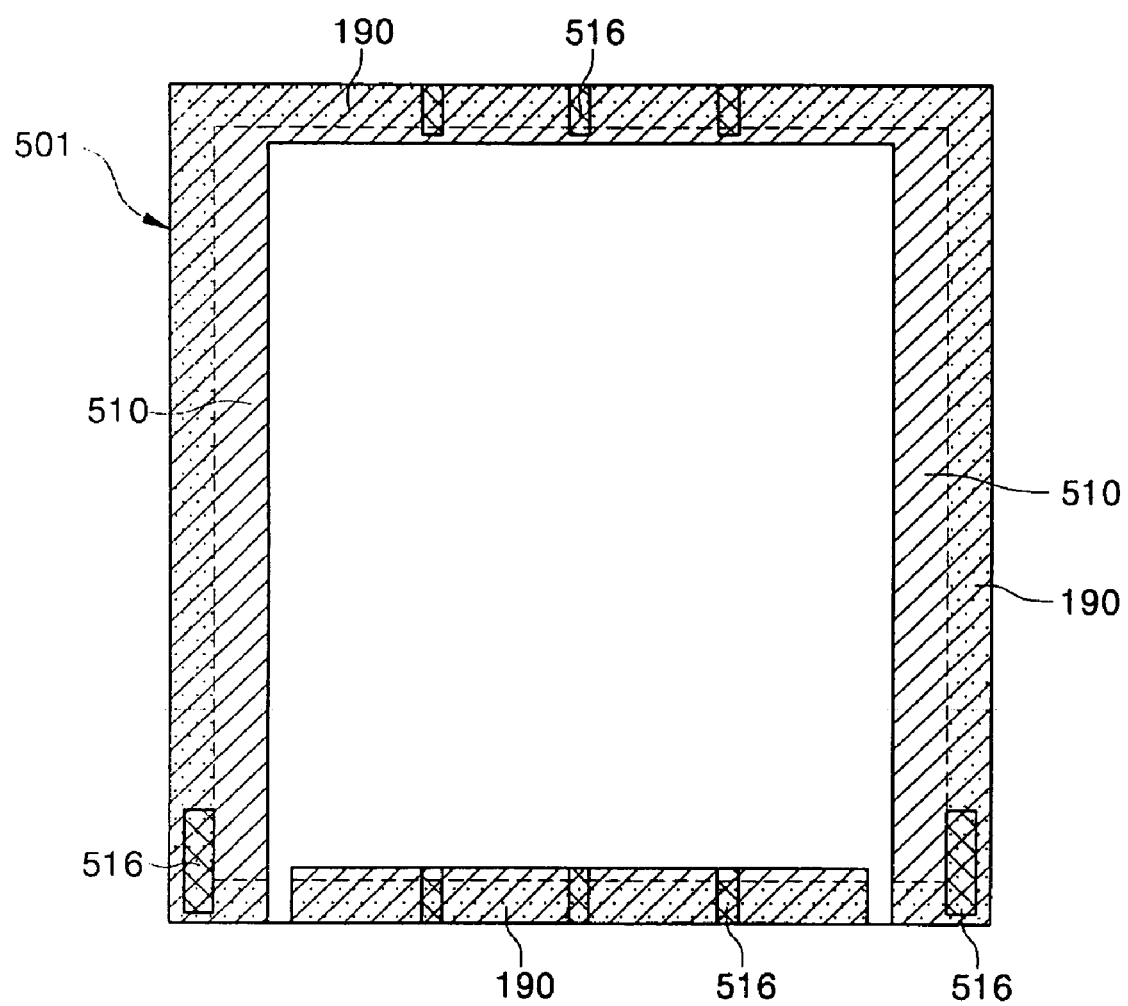

FIGS. 5A and 5B respectively illustrate a plan view of a substrate and a bottom view of an encapsulation substrate of an OLED display device according to a fourth exemplary embodiment of the present invention.

Referring to FIG. 5A, a display region 550 including predetermined pixels is disposed on a substrate 500. Common power lines 560, scan lines (not shown), and data lines (not shown) are disposed in the display region 550. The common power lines 560 are used to apply a voltage to the respective pixels. The scan lines are connected to a scan driver 140 that outputs selection signals, and the data lines are connected to a data driver 130 that outputs data signals.

In the present embodiment, no common power supply line 510 is disposed on the substrate 500. That is, the common power supply line 510 is disposed in a predetermined region of an encapsulation substrate 501 that will be described later, instead of around the display region 550. As a result, interconnection lines other than the common power supply line 510 may be disposed around the display region 550 or the display region 550 can be further expanded. Specifically, a cathode electrode 520 is disposed over the display region 550, and a cathode power supply line 570 may be disposed on a left peripheral region of the display region 550. Here, the cathode power supply line 570 overlaps the cathode electrode 520 and applies a cathode voltage to the cathode electrode 520. Also, the display region 550 may be further expanded downward. Unlike in the cases of the previous embodiments, a long pad 180 is disposed on the substrate 500 such that the pad 180 is electrically connected to the common power supply line 510 that is disposed on the encapsulation substrate 501 as described later. That is, the pad 180 may extend to a region where the substrate 500 is bonded to the encapsulation substrate 501.

FIG. 5B shows a bottom surface of the encapsulation substrate 501.

Referring to FIG. 5B, the common power supply line 510 is disposed on a surface of the encapsulation substrate 501 opposite to the substrate 500. The common power supply line 510 may be disposed on peripheral regions of the encapsulation substrate 501.

Referring again to FIGS. 5A and 5B together, the common power supply line 510 disposed on the encapsulation substrate 501 is electrically connected to the common power lines 560 and the pad 180 that are disposed on the substrate 500. Specifically, portions of the common power supply line 510 disposed on top and bottom areas of the encapsulation substrate 501 are electrically connected to end portions of the common power lines 560 disposed on the substrate 500. Also, portions of the common power supply line 510 disposed on left and right sides of the encapsulation substrate 501 are electrically connected to the pad 180 disposed on the substrate 500. The common power supply line 510 disposed on the encapsulation substrate 501 may be electrically connected to the common power lines 560 and the pad 180 that are disposed on the substrate 500 using a conductive material. The conductive material may be an ACF. The ACF may be disposed in a connection portion 516 between the common power supply line 510 disposed on the encapsulation substrate 501 and the common power lines 560 and the pad 180 that are disposed on the substrate 500.

In this case, the common power lines 560 disposed on the substrate 500 may extend to top and bottom areas of the substrate 500 so that the common power lines 560 can be electrically connected to the common power supply line 510 disposed on the encapsulation substrate 501.

The OLED display device of the present embodiment is similar to the OLED display device of the first embodiment except for the above described differences.

Figure 6A:
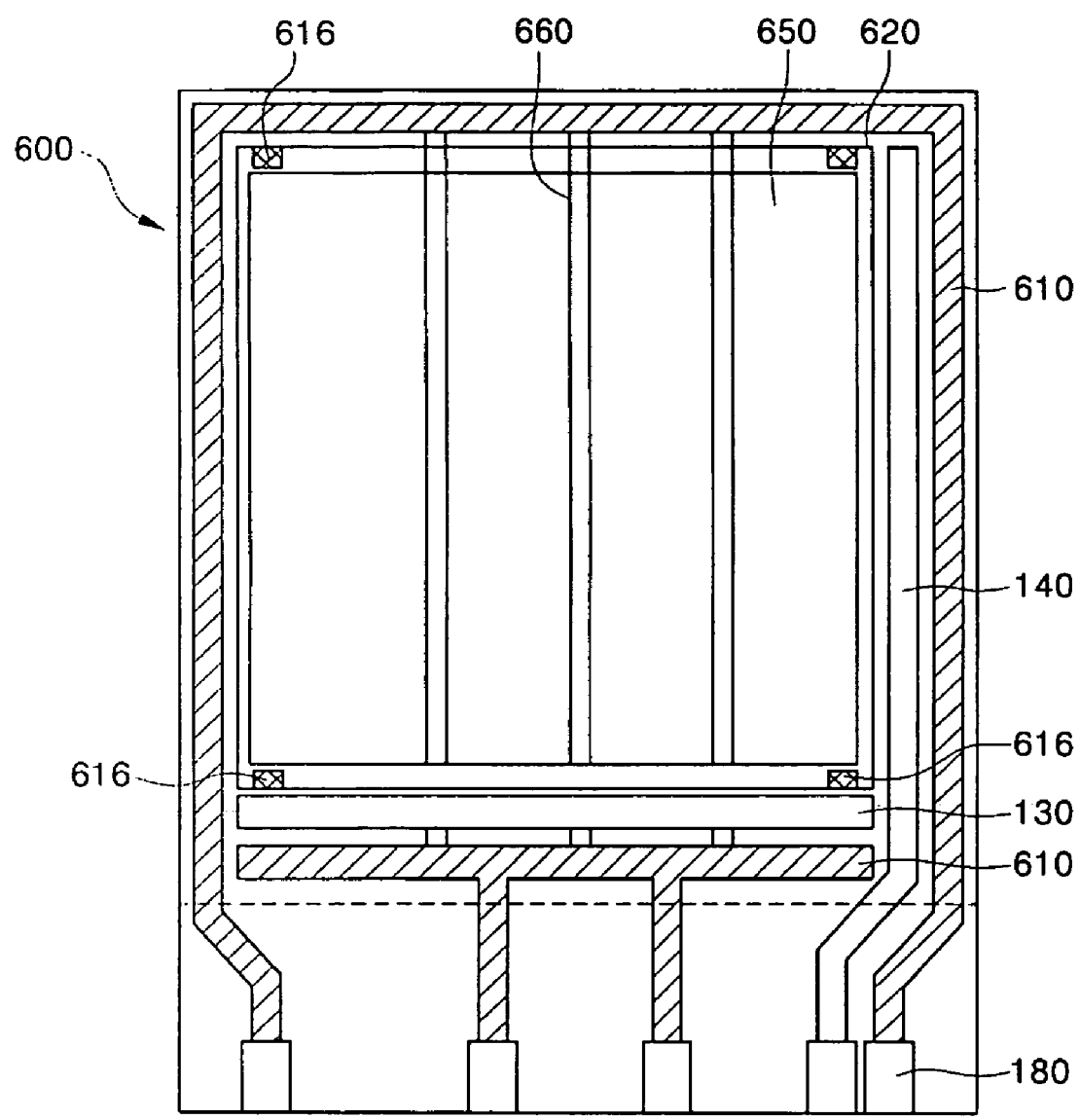
FIGS. 6A and 6B respectively illustrate a plan view of a substrate and a bottom view of an encapsulation substrate of an OLED display device according to a fifth exemplary embodiment of the present invention.
Figure 6B:
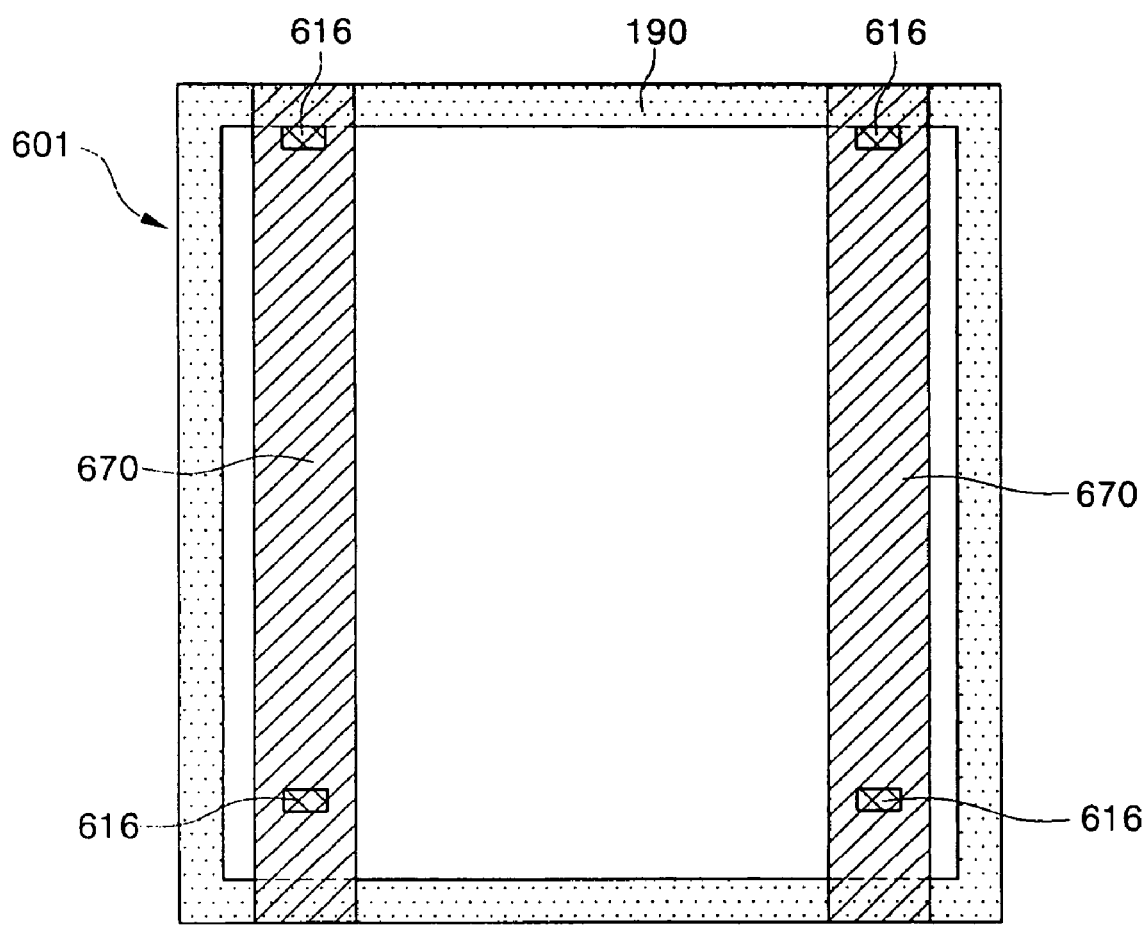

FIGS. 6A and 6B respectively illustrate a plan view of a substrate and a bottom view of an encapsulation substrate of an OLED display device according to a fifth exemplary embodiment of the present invention.

Referring to FIG. 6A, a display region 650 including predetermined pixels is disposed on a substrate 600. Common power lines 660, scan lines (not shown), and data lines (not shown) are disposed in the display region 650. The common power lines 660 are used to apply a voltage to their respective pixels. The scan lines are connected to a scan driver 140 that outputs selection signals, and the data lines are connected to a data driver 130 that outputs data signals. A cathode electrode 620 is disposed over the display region 650.

In the fifth embodiment, no cathode power supply line is disposed on the substrate 600. A cathode power supply line 670, shown in FIG. 6B, does not overlap the cathode electrode 620 but is disposed in a predetermined region of an encapsulation substrate 601 that will be described later. Thus, the display region 650 can be further expanded. That is, a space otherwise occupied by the cathode power supply line 670 can be used as the display region 650.

FIG. 6B shows a bottom surface of the encapsulation substrate 601.

The cathode power supply line 670 is disposed on a surface of the encapsulation substrate 601 opposite to the substrate 600. The cathode power supply line 670 is disposed on left and right sides of the encapsulation substrate 601. However, the present invention is not limited thereto but a sectional area of the cathode power supply line 670 may be enlarged to decrease line resistance and reduce voltage drop. Also, the cathode power supply line 670 is not limited to a straight line shape, but may have various shapes.

Referring to FIGS. 6A and 6B together, the cathode power supply line 670 disposed on the encapsulation substrate 601 is electrically connected to the cathode electrode 620 disposed on the substrate 600 using a conductive material. Specifically, the conductive material is disposed in a connection portion 616 between the cathode power supply line 670 disposed on the encapsulation substrate 601 and a region of the cathode electrode 620 where the cathode electrode 620 does not overlap the display region 650. The conductive material may be an ACF.

In another embodiment, an insulating layer (not shown) may be disposed on the cathode electrode 620. At least one contact hole may be made in a portion of the insulating layer corresponding to the connection portion 616 and filled with the conductive material so that the cathode electrode 620 can be electrically connected to the cathode power supply line 670.

The OLED display device of the fifth embodiment may be similar to the OLED display device of the first embodiment except for the above described differences.

According to the present invention as described above, an interconnection line is disposed in a predetermined region of an encapsulation substrate corresponding to a portion of a substrate on which no interconnection line is disposed. Alternatively, a common power supply line is disposed only on the encapsulation substrate. As a result, a dead space can be reduced so that interconnection or other lines can be disposed in the portion of the substrate where the interconnection line was conventionally disposed, and a display region can be further expanded. Furthermore, since a wide interconnection line can be disposed on the encapsulation substrate, a voltage drop can be reduced.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. An organic light emitting display device comprising:
   an interconnection line comprising a first portion and a second portion, at least the second portion extending in a first direction;
   a substrate including a display region and the first portion of the interconnection line, the display region comprising pixels; and
   an encapsulation substrate disposed over the substrate and having a surface opposite to the substrate, the encapsulation substrate including the second portion of the interconnection line at a region of the surface opposite to the substrate,
   wherein the second portion of the interconnection line is spaced apart from the first portion of the interconnection line in a second direction that is substantially perpendicular to the first direction and substantially parallel to the surface opposite to the substrate.

2. The organic light emitting display device according to claim 1, wherein the interconnection line is a power supply line for supplying power to power lines disposed on the substrate.

3. The organic light emitting display device according to claim 2,
   wherein the power supply line includes a first power supply line portion located on the substrate and a second power supply line portion located on the encapsulation substrate, and
   wherein the first power supply line portion is electrically connected to the second power supply line portion.

4. The organic light emitting display device according to claim 3, wherein the second power supply line portion is electrically connected to the first power supply line portion using a conductive material.

5. The organic light emitting display device according to claim 4, wherein the conductive material comprises an anisotropic conductive material.

6. The organic light emitting display device according to claim 1, wherein the display region further comprises:
an anode electrode;
a cathode electrode; and
an organic thin layer interposed between the anode electrode and the cathode electrode.

7. The organic light emitting display device according to claim 6, wherein the interconnection line is a cathode power supply line for applying a voltage to the cathode electrode.

8. The organic light emitting display device according to claim 7,
wherein the cathode power supply line includes a first cathode power supply line portion disposed on the substrate and a second cathode power supply line portion disposed on the encapsulation substrate, and
wherein the first cathode power supply line portion is electrically connected to the second cathode power supply line portion.

9. The organic light emitting display device according to claim 8, wherein the first cathode power supply line portion and the anode electrode are formed of the same material.

10. The organic light emitting display device according to claim 8, wherein the second cathode power supply line portion is electrically connected to the first cathode power supply line portion using a conductive material.

11. The organic light emitting display device according to claim 10, wherein the conductive material comprises an anisotropic conductive material.

12. An organic light emitting display device comprising:
an interconnection line comprising a first portion and a second portion;
a substrate including a display region and the first portion of the interconnection line, the display region comprising pixels; and
an encapsulation substrate disposed over the substrate and having a surface opposite to the substrate, the encapsulation substrate including the second portion of the interconnection line at a region of the surface opposite to the substrate,
wherein the region including the second portion of the interconnection line is disposed at a portion of the encapsulation substrate other than a portion of the encapsulation substrate corresponding to the first portion of the interconnection line on the substrate,
wherein the interconnection line is a power supply line for supplying power to power lines disposed on the substrate, and
wherein the second portion is wider than the first portion.

13. An organic light emitting display device comprising:
an interconnection line comprising a first portion and a second portion;
a substrate including a display region and the first portion of the interconnection line, the display region comprising pixels; and
an encapsulation substrate disposed over the substrate and having a surface opposite to the substrate, the encapsulation substrate including the second portion of the interconnection line at a region of the surface opposite to the substrate,
wherein the region including the second portion of the interconnection line is disposed at a portion of the encapsulation substrate other than a portion of the encapsulation substrate corresponding to the first portion of the interconnection line on the substrate,
wherein the display region further comprises:
an anode electrode;
a cathode electrode; and
an organic thin layer interposed between the anode electrode and the cathode electrode,
wherein the interconnection line is a cathode power supply line for applying a voltage to the cathode electrode,
wherein the cathode power supply line includes a first cathode power supply line portion disposed on the substrate and a second cathode power supply line portion disposed on the encapsulation substrate,
wherein the first cathode power supply line portion is electrically connected to the second cathode power supply line portion, and
wherein the second cathode power supply line portion is wider than the first cathode power supply line portion.

14. An organic light emitting display device comprising:
a substrate including a display region and power lines, the power lines extending in a first direction, the display region comprising pixels; and
an encapsulation substrate disposed over the substrate and having a surface opposite to the substrate, the encapsulation substrate including a power supply line disposed at a region of the encapsulation substrate opposite to the substrate, the power supply line extending in the first direction,
wherein the power supply line is spaced apart from the power lines in a second direction that is substantially perpendicular to the first direction and substantially parallel to the surface opposite to the substrate.

15. The organic light emitting display device according to claim 14,
wherein the substrate further includes a pad located on the substrate, and
wherein the power supply line is electrically connected to the power lines and the pad.

16. The organic light emitting display device according to claim 15, wherein the power supply line is electrically connected to the power lines and the pad using a conductive material.

17. The organic light emitting display device according to claim 16, wherein the conductive material comprises an anisotropic conductive material.

18. The organic light emitting display device according to claim 14,
wherein the display region further comprises an anode electrode, a cathode electrode, and an organic thin layer interposed between the anode electrode and the cathode electrode,
wherein the encapsulation substrate further includes a cathode power supply line disposed at another region of the encapsulation substrate opposite to the substrate, and
wherein the cathode power supply line is disposed only on the encapsulation substrate.

19. The organic light emitting display device according to claim 18, wherein the cathode power supply line is electrically connected to the cathode electrode.

20. The organic light emitting display device according to claim 19, wherein the cathode power supply line is electrically connected to the cathode electrode using a conductive material.

21. The organic light emitting display device according to claim 20, wherein the conductive material comprises an anisotropic conductive material.

22. An organic light emitting display device comprising:
- a substrate including a display region, the display region comprising pixels; and
- an encapsulation substrate disposed over the substrate and including a power supply line disposed at a region of the encapsulation substrate opposite to the substrate,
- wherein the power supply line is disposed only on the encapsulation substrate,
- wherein the display region further comprises an anode electrode, a cathode electrode, and an organic thin layer interposed between the anode electrode and the cathode electrode,
- wherein the encapsulation substrate further includes a cathode power supply line disposed at another region of the encapsulation substrate opposite to the substrate,
- wherein the cathode power supply line is disposed only on the encapsulation substrate,
- wherein the cathode power supply line is electrically connected to the cathode electrode,
- wherein the organic light emitting display device further comprises an insulating layer disposed on the cathode electrode, and
- wherein the cathode power supply line is electrically connected to the cathode electrode through at least one contact hole formed in the insulating layer.

\* \* \* \* \*